United States Patent
Balakrishnan et al.

(10) Patent No.: US 9,947,675 B1
(45) Date of Patent: Apr. 17, 2018

(54) MASK-PROGRAMMABLE ROM USING A VERTICAL FET INTEGRATION PROCESS

(71) Applicant: International Business Machines Corporation, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/280,587

(22) Filed: Sep. 29, 2016

(51) Int. Cl.
| | | |
|---|---|---|
| *H01L 27/112* | (2006.01) | |
| *H01L 29/78* | (2006.01) | |
| *H01L 29/08* | (2006.01) | |
| *H01L 29/423* | (2006.01) | |
| *H01L 23/528* | (2006.01) | |
| *H01L 29/06* | (2006.01) | |
| *H01L 29/10* | (2006.01) | |
| *H01L 21/8234* | (2006.01) | |

(52) U.S. Cl.
CPC ........... *H01L 27/11273* (2013.01); *H01L 21/823418* (2013.01); *H01L 21/823437* (2013.01); *H01L 21/823475* (2013.01); *H01L 21/823481* (2013.01); *H01L 21/823487* (2013.01); *H01L 23/528* (2013.01); *H01L 29/0649* (2013.01); *H01L 29/0847* (2013.01); *H01L 29/1033* (2013.01); *H01L 29/42356* (2013.01); *H01L 29/7827* (2013.01)

(58) Field of Classification Search
CPC ............... H01L 27/11253; H01L 27/11273
See application file for complete search history.

(56) References Cited

U.S. PATENT DOCUMENTS 9,647,123 B1 * 5/2017 Balakrishnan ........ H01L 29/785

\* cited by examiner

*Primary Examiner* — Yu-Hsi D Sun
(74) *Attorney, Agent, or Firm* — Scully, Scott, Murphy & Presser, P.C.; Louis J. Percello, Esq.

(57) ABSTRACT

A mask programmable read-only memory (PROM) cell is provided utilizing a vertical transistor processing flow. PROM programming is performed during the processing flow itself. Notably, "0" or "1" state can be programmed by tuning the threshold voltage of the vertical transistor by controlling the doping concentration of the epitaxially grown semiconductor channel material.

20 Claims, 10 Drawing Sheets

MASK-PROGRAMMABLE ROM USING A VERTICAL FET INTEGRATION PROCESS

BACKGROUND

The present application relates to a semiconductor structure and a method of forming the same. More particularly, the present application relates to a mask programmable read-only memory (PROM) cell that is formed utilizing a vertical transistor processing flow.

Conventional vertical transistors are devices where the source-drain current flows in a direction normal to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control. As such, vertical transistors are an attractive option for technology scaling for 5 nm and beyond.

Floating gate memory cells, which form the basis of non-volatile memory such as, for example, flash, PROM, EPROM and EEPROM memory are crucial to the implementation of any technology. A PROM (i.e., programmable read-only memory) is a form of a digital memory where the setting of each bit is typically locked by a fuse element or an antifuse element. The data within a PROM is permanent and cannot be changed. The data within conventional PROMs is programmed after manufacturing the memory cell. In typically PROM cells, the transistors are formed utilizing non-vertical transistor technology. In view of the advantages with vertical transistor designs, there is a need for providing a PROM cell using vertical transistor technology in which programming of the PROM may be formed during, rather than after, the manufacturing process.

SUMMARY

A mask programmable read-only memory (PROM) cell is provided utilizing a vertical transistor processing flow. PROM programming is performed during the processing flow itself. Notably, a "0" or "1" state can be programmed by tuning the threshold voltage of the vertical transistor by controlling the doping concentration of the epitaxially grown semiconductor channel material.

One aspect of the present application relates to a programmable read-only memory (PROM) cell. In one embodiment of the present application, the programmable read-only memory (PROM) cell may include a first vertical transistor programmed to store a "0" state and located in a first device region of a base semiconductor substrate. The first vertical transistor includes a first bottom source/drain structure, a first epitaxial semiconductor channel material of a first dopant concentration extending upward from a topmost surface of the first bottom source/drain structure, the first epitaxial semiconductor channel material having a lower portion of a first width and an upper portion of a second width that is less than the first width, a first functional gate structure located on each side of the lower portion of the first epitaxial semiconductor channel material, and a first top source/drain structure extending outward from each sidewall of the upper portion of the first epitaxial semiconductor channel material. The PROM cell further includes a second vertical transistor programmed to store a "1" state and located in a second device region of the base semiconductor substrate. The second vertical transistor includes a second bottom source/drain structure, a second epitaxial semiconductor channel material of a second dopant concentration different from the first dopant concentration extending upward from a topmost surface of the second bottom source/drain structure, the second epitaxial semiconductor channel material having a lower portion of a first width and an upper portion of a second width that is less than the first width, a second functional gate structure located on each side of the lower portion of the second epitaxial semiconductor channel material, and a second top source/drain structure extending outward from each sidewall of the upper portion of the second epitaxial semiconductor channel material.

Another aspect of the present application relates to a method of forming a programmable read-only memory (PROM) cell. In one embodiment of the present application, the method may include forming, in any order, a first epitaxial semiconductor channel material having a first dopant concentration extending upward from a first portion of a topmost surface of a bottom source/drain semiconductor material layer that is located above a base semiconductor substrate, and a second epitaxial semiconductor channel material having a second dopant concentration different from the first dopant concentration extending upward from a second portion of the topmost surface of the bottom source/drain semiconductor material layer, wherein the first and second epitaxial semiconductor channel materials each have a lower portion of a first width and an upper portion of a second width that is less than the first width. Next, a first top source/drain structure is formed extending outward from each sidewall of the upper portion of the first epitaxial semiconductor channel material and contacting exposed portions of a topmost surface of the lower portion of the first epitaxial semiconductor channel material, and a second top source/drain structure is also formed extending outward from each sidewall of the upper portion of the second epitaxial semiconductor channel material and contacting exposed portions of a topmost surface of the lower portion of the second epitaxial semiconductor channel material. A first functional gate structure is then formed on each side of the lower portion of the first epitaxial semiconductor channel material, and a second functional gate structure is also formed each side of the lower portion of the second epitaxial semiconductor channel material. In accordance with the present application, the first dopant concentration programs each first functional gate structure to store a "0" state, and the second dopant concentration programs each second functional gate structure to store a "1" state.

DETAILED DESCRIPTION

Figure 1:
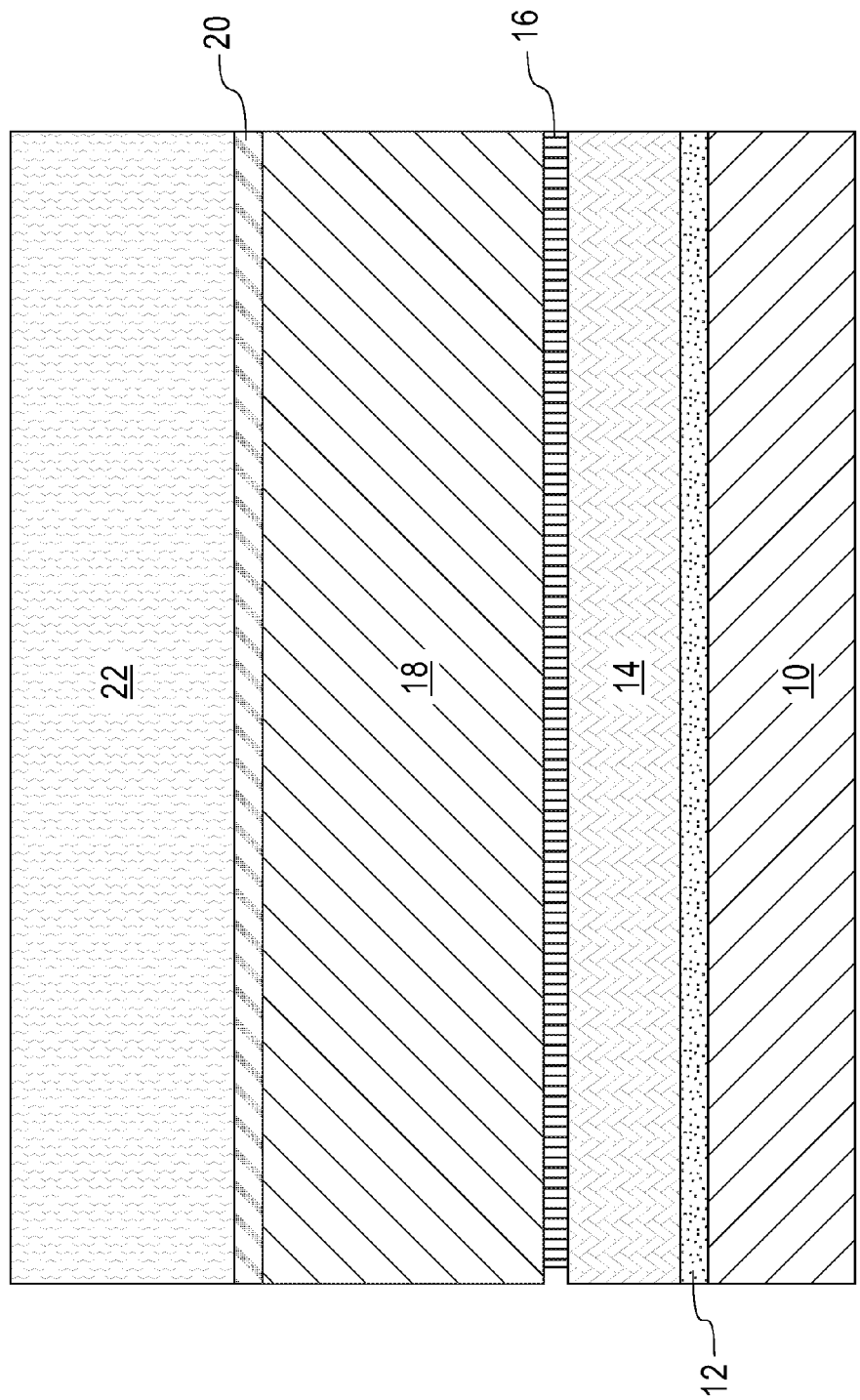
FIG. 1 is a cross sectional view of an exemplary semiconductor structure including a material stack of, from bottom to top, a semiconductor material layer of a first conductivity type, a bottom source/drain semiconductor material layer of a second conductivity type that is opposite the first conductivity type, a bottom spacer layer, a sacrificial gate material layer, a top spacer layer, and a hard mask layer, the material stack is located on a base semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals. The terms "first" and "second" are arbitrarily used in the present application and by no ways suggest a specific order of forming a material or structure.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in one embodiment of the present application. The exemplary semiconductor structure of FIG. 1 includes a material stack of, from bottom to top, a semiconductor material layer 12 of a first conductivity type, a bottom source/drain semiconductor material layer 14 of a second conductivity type that is opposite the first conductivity type, a bottom spacer layer 16, a sacrificial gate material layer 18, a top spacer layer 20, and a hard mask layer 22. The material stack (12, 14, 16, 18, 20, 22) is located on a base semiconductor substrate 10. In some embodiments, the semiconductor material layer 12 may be omitted.

The base semiconductor substrate 10 may include at least one semiconductor material having semiconducting properties. Examples of semiconductor materials that may provide at least a portion of the base semiconductor substrate 10 include silicon (Si), germanium (Ge), silicon germanium alloys (SiGe), silicon carbide (SiC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the base semiconductor substrate 10 is a bulk semiconductor substrate. By "bulk" it is meant that the semiconductor substrate is entirely composed of at least one semiconductor material, as defined above. In one example, the base semiconductor substrate 10 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

In another embodiment of the present application, the base semiconductor substrate 10 may comprise a topmost semiconductor material layer of a semiconductor-on-insulator (SOI) substrate. The SOI substrate would also include a handle substrate (not shown) including one of the above mentioned semiconductor materials, and an insulator layer (not shown) such as a buried oxide below the topmost semiconductor material layer.

In any of the embodiments mentioned above, the semiconductor material that provides the base semiconductor substrate 10 may be a single crystalline semiconductor material. The semiconductor material that provides the base semiconductor substrate 10 may have any of the well known crystal orientations. For example, the crystal orientation of the base semiconductor substrate 10 may be {100}, {110}, or {111}. Other crystallographic orientations besides those specifically mentioned can also be used in the present application.

The semiconductor material layer 12 of the first conductivity type may include one of the semiconductor materials mentioned above for providing the base semiconductor substrate 10. In one embodiment, the semiconductor material layer 12 may be composed of a same semiconductor material as the base semiconductor substrate 10. For example, the base semiconductor substrate 10 and the semiconductor material layer 12 may be composed of silicon. In yet another embodiment, the semiconductor material layer 12 may be composed of a different semiconductor material than the semiconductor base substrate 10. For example, the base semiconductor substrate 10 may composed of silicon, while the semiconductor material layer 12 may composed of a silicon germanium alloy or germanium.

The first conductivity type of the semiconductor material layer 12 may be provided by a p-type or n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment of the present application, the concentration of n-type or p-type dopant within the semiconductor material layer 12 can range from $5\times10^{18}$ atoms/cm$^3$ to $5\times10^{19}$ atoms/cm$^3$, although dopant concentrations greater than or lesser than this range are also conceived. In one embodiment, the doping within the semiconductor material layer 12 may be uniform (i.e., have a uniform distribution of dopants throughout the entire region). In another embodiment, the doping within the semiconductor material layer 12 may be graded. The semiconductor material layer 12 is oppositely doped to the bottom source/drain semiconductor material layer 14 so as to act as a punch through stop layer.

In one embodiment of the present application, the semiconductor material layer 12 may have a thickness from 50 nm to 200 nm. Other thicknesses that are lesser than, or greater than, the aforementioned thickness range may also be employed in the present application as the thickness of the semiconductor material layer 12.

The bottom source/drain semiconductor material layer 14 of the second conductivity type may include one of the semiconductor materials mentioned above for providing the base semiconductor substrate 10. In one embodiment, the bottom source/drain semiconductor material layer 14 may be composed of a same semiconductor material as the semiconductor material layer 12 and the base semiconductor substrate 10. For example, the base semiconductor substrate 10, the semiconductor material layer 12 and the bottom source/drain semiconductor material layer 14 may all be composed of silicon. In yet another embodiment, the bottom source/drain semiconductor material layer 14 may be composed of a different semiconductor material than at least one of the semiconductor base substrate 10 or the semiconductor material layer 12. For example, the base semiconductor substrate 10 may be composed of silicon, the semiconductor material layer 12 may be composed of silicon, and the bottom source/drain semiconductor material layer 14 may be composed of a silicon germanium alloy or germanium.

The second conductivity type of the bottom source/drain semiconductor material layer 14 may be provided by a p-type or n-type dopant, as defined above, with the proviso that the second conductivity type is opposite to the first conductivity type. In one example, and when the first conductivity type is n-type, then the second conductivity type is p-type. In another example, and when the first conductivity type is p-type, then the second conductivity type is n-type.

The concentration of n-type or p-type dopant within the bottom source/drain semiconductor material layer 14 is typically greater than the concentration of dopant present in the semiconductor material layer 12. In one example, the concentration of dopant within the bottom source/drain semiconductor material layer 14 can range from $1\times10^{20}$ atoms/cm$^3$ to $2\times10^{21}$ atoms/cm$^3$.

In one embodiment of the present application, the bottom source/drain semiconductor material layer 14 may have a thickness from 20 nm to 50 nm. Other thicknesses that are lesser than, or greater than, the aforementioned thickness range may also be employed in the present application as the thickness of the bottom source/drain semiconductor material layer 14.

In one embodiment of the present application, the base semiconductor substrate 10, the semiconductor material layer 12, and the bottom source/drain semiconductor material layer 14 are formed by first providing the base semiconductor substrate 10. An epitaxial growth (or deposition) process may then be employed to form the semiconductor material layer 12 and the bottom source/drain semiconductor material layer 14. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing semiconductor material layer 12 and bottom source/drain semiconductor material layer 14, semiconductor material layer 12 and bottom source/drain semiconductor material layer 14 have an epitaxial relationship with each other as well as topmost surface of the base semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition may result in crystal defects and film cracking. The epitaxial growth of semiconductor material layer 12 and bottom source/drain semiconductor material layer 14 can be performed utilizing any well known precursor gas or gas mixture. Carrier gases like hydrogen, nitrogen, helium and argon can be used. In some embodiments, a dopant that provides the specific conductivity type to the semiconductor material layer 12 and the bottom source/drain semiconductor material layer 14 may be introduced in-situ into the precursor gas or gas mixture that provides the semiconductor material layer 12 and/or the bottom source/drain semiconductor material layer 14. In another embodiment, a dopant that provides the specific conductivity type may be introduced into an intrinsic semiconductor material that can be used as semiconductor material layer 12 and/or bottom source/drain semiconductor material layer 14 by ion implantation or gas phase doping.

In another embodiment of the present application, the base semiconductor substrate 10, the semiconductor material layer 12, and the bottom source/drain semiconductor material layer 14 are formed by first providing the base semiconductor substrate 10. Dopants that provide the specific conductivity type of the semiconductor material layer 12 and/or bottom source/drain semiconductor material layer 14 may then be introduced into base semiconductor substrate 10 by ion implantation or gas phase doping.

In another embodiment of the present application, the base semiconductor substrate 10, the semiconductor material layer 12, and the bottom source/drain semiconductor material layer 14 can be formed utilizing one or more wafer bonding processes.

After providing the base semiconductor substrate 10, the semiconductor material layer 12, and the bottom source/drain semiconductor material layer 14, the bottom spacer layer 16 is formed on a topmost surface of the bottom source/drain semiconductor material layer 14. The bottom spacer layer 16 may comprise a dielectric material including, for example, silicon dioxide, silicon nitride and/or silicon oxynitride. The bottom spacer layer 16 can be formed by a deposition process such as, for example, chemical vapor deposition (CVD) or plasma enhanced chemical vapor deposition (PECVD). In other embodiments, the bottom spacer layer 16 can be formed by a thermal process such as, for example, thermal oxidation and/or thermal nitridation. In yet other embodiments, the bottom spacer layer 16 can be formed by a combination of a deposition process and a thermal process. The thickness of the bottom spacer layer 16 can range from 4 nm to 12 nm. Other thicknesses that are lesser than, or greater than, the aforementioned thickness range may also be employed as the thickness of the bottom spacer layer 16.

Next, the sacrificial gate material layer 18 is formed on a topmost surface of the bottom spacer layer 16. The sacrificial gate material layer 18 may include a material such as, for example, polysilicon or amorphous silicon. The sacrificial gate material layer 18 can be formed utilizing a deposition process including, for example, chemical vapor deposition (CVD), plasma enhanced chemical vapor deposition (PECVD), physical vapor deposition (PVD), sputtering, or atomic layer deposition (ALD). The thickness of the sacrificial gate material layer 18 can range from 50 nm to 200 nm. Other thicknesses that are lesser than, or greater than, the aforementioned thickness range may also be employed as the thickness of the sacrificial gate material layer 18.

The top spacer layer 20 is then formed on a topmost surface of the sacrificial gate material layer 18. The top spacer layer 20 may include one of the dielectric materials mentioned above for the bottom spacer layer 16. In one embodiment of the present application, the top spacer layer 20 and the bottom layer 16 include a same dielectric material. For example, the top spacer layer 20 and the bottom spacer layer 16 may both be composed of silicon nitride. In another embodiment of the present application, the top spacer layer 20 and the bottom spacer layer 16 comprise different dielectric materials. For example, the top spacer layer 20 may be composed of silicon nitride, while the bottom spacer layer 16 may be composed of silicon oxynitride. The top spacer layer 20 may be formed utilizing one of the deposition processes mentioned above for forming the bottom spacer layer 16. The top spacer layer 20 may have a thickness that is within the thickness range mentioned above for the bottom spacer layer 16.

Next, the hard mask layer 22 is formed on the topmost surface of the top spacer layer 20. The hard mask layer 22 is a contiguous hard mask material that covers the entirety of the top spacer layer 20. The hard mask layer 22 that is employed in the present application may include an oxide, a nitride and/or an oxynitride, with the proviso that the hard mask layer 22 has a different etch rate than the underlying top spacer layer 20. In one example, the hard mask layer 22 may be composed of silicon dioxide, while the top spacer layer 20 may be composed of silicon nitride. The hard mask layer 22 can be formed utilizing a deposition process such as described above in forming the bottom spacer layer 16. The thickness of the hard mask layer 22 can range from 20 nm to 150 nm. Other thicknesses that are lesser than, or greater than, the aforementioned thickness range may also be employed as the thickness of the hard mask layer 22.

Figure 2:
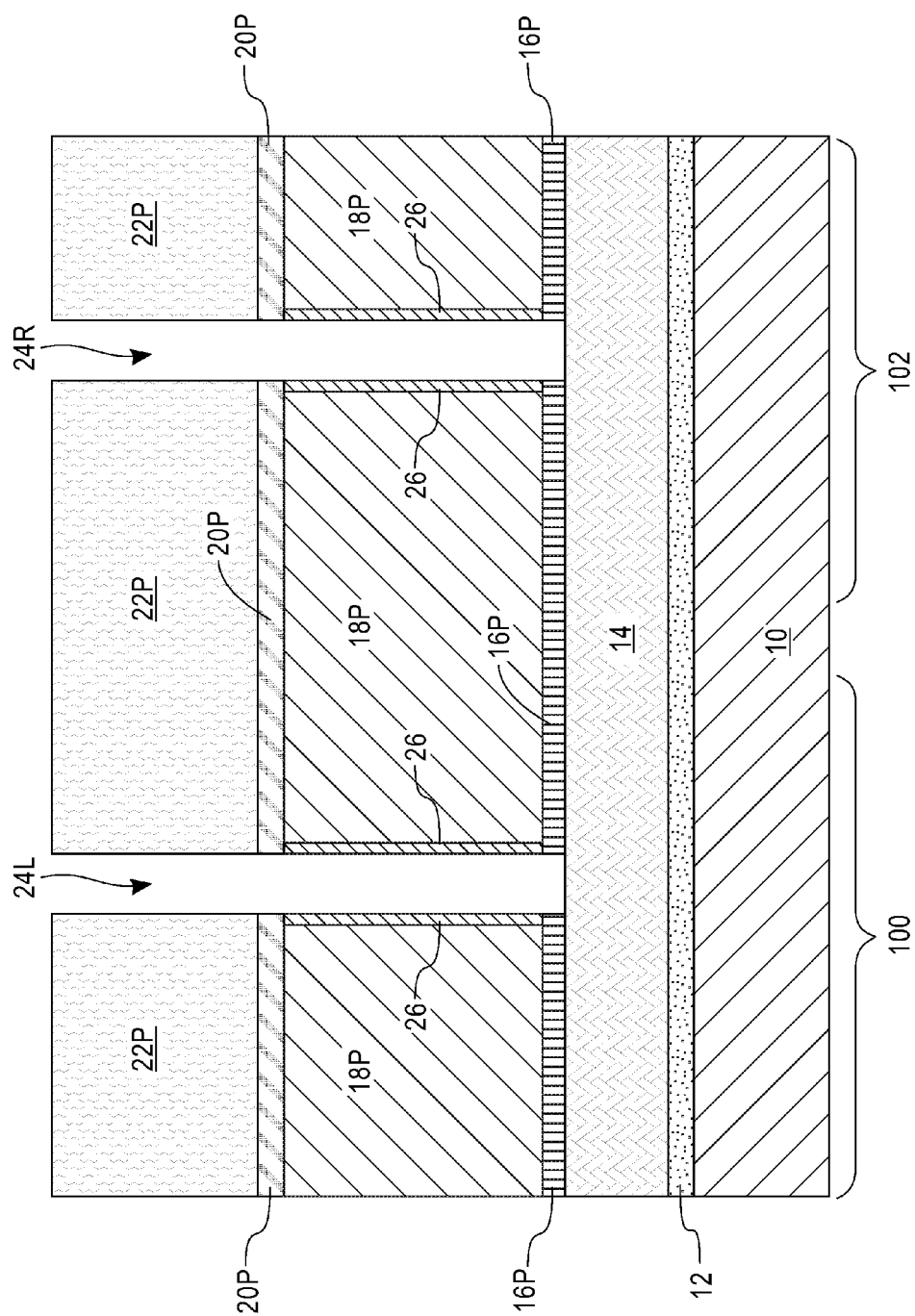
FIG. 2 is a cross sectional view of the exemplary semiconductor structure of FIG. 1 after forming a first opening in the material stack and in a first device region, and a second opening in the material stack and in a second device region, and forming an oxide liner into exposed sidewalls of each remaining portion of the sacrificial gate material layer in both the first and second openings.

Referring now to FIG. 2, there is illustrated the exemplary semiconductor structure of FIG. 1 after forming a first opening 24L in the material stack and in a first device region 100, and a second opening 24R in the material stack and in a second device region 102, and forming an oxide liner 26 into exposed sidewalls of each remaining portion of the sacrificial gate material layer (i.e., sacrificial gate material portions 18P) in both the first and second openings 24L, 24R. Although the present application describes and illustrates a single first opening 24L and a single second opening 24R formed in their respective device regions 100, 102, a plurality of first openings 24L and a plurality of second openings 24R can be formed in their respective device regions 100, 102. The present application also contemplates other openings formed into the material stack and present in other device regions, such as, for example, logic device regions (not shown).

Each opening (24L, 24R) extends through the hard mask layer 22, the top spacer layer 20, the sacrificial gate material layer 18 and the bottom spacer layer 16 of the material stack shown in FIG. 1. Each opening (24L, 24R) exposes a portion of the topmost surface of the bottom source/drain semiconductor material layer 14. Each opening (24L, 24R) is formed in a different device region. For example, first opening 24L can be present in the first device region 100, while second opening 24R can be formed in the second device region 102. The first and second device regions 100, 102 may lie laterally adjacent to each other or they may be separated by additional device regions.

Each opening (24L, 24R) may be formed by utilizing any well known patterning process. In one embodiment of the present application, the patterning process used to define each opening (24L, 24R) may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing one or more etching process. Typically, the one or more etching processes include an anisotropic etch such as, for example, reactive ion etching.

In another embodiment, the patterning process used to define each opening (24L, 24R) may include a sidewall image transfer (SIT) process. In yet another embodiment, the patterning process used to define each opening (24L, 24R) may include a direct self-assembly (DSA) patterning process. In each of SIT and DSA, one or more anisotropic etching process can be employed.

Each opening (24L, 24R) that is formed can have a width from 4 nm to 12 nm. The width of opening (24L, 24R) will determine the width of the channel material to be subsequently formed therein. Other widths that are lesser than or greater than the aforementioned width range may also be employed in the present application.

Each opening (24L, 24R) can be formed at the same time or one opening can be formed first and then a channel material and a dielectric cap can be formed in the one opening, and another opening can then be formed, followed by the formation of a channel material and a dielectric cap in the another opening.

After forming the opening (i.e., 24L and/or 24R), portions of the hard mask layer 22, the top spacer layer 20, the sacrificial gate material layer 18, and the bottom spacer layer 16 remain laterally surrounding each opening (24L, 24R). Each remaining portion of the hard mask layer 22 may be referred to herein as a hard mask portion 22P, each remaining portion of the top spacer layer 20 may be referred to herein as top spacer portion 20P, each remaining portion of the sacrificial gate material layer 18 may be referred to herein as a sacrificial gate material portion 18P, and each remaining portion of the bottom spacer layer 16 may be referred to herein as a bottom spacer portion 16P.

In some embodiments of the present application, an extension implant may now be performed in the opening (24L and/or 24R) to provide a source/drain extension region (not shown) within the exposed portion of the bottom source/drain semiconductor material layer 14. In such an embodiment, the outermost edges of the source/drain extension region (not shown) are vertically aligned to the sidewall surfaces of each hard mask portion 22P, each top spacer portion 20P, each sacrificial gate material portion 18P (prior to oxide liner 26 formation), and each bottom spacer portion 16P.

Oxide liner 26 is then formed into exposed sidewalls of each remaining portion of the sacrificial gate material layer (i.e., the sacrificial gate material portions 18P) with each opening (24L and/or 24R). The oxide liner 26 can be formed utilizing an oxidation process such as, for example, a plasma oxidation process, thermal oxidation process or a chemical oxidation process. The oxidation process used to form the oxide liner 26 converts the exposed portion of each sacrificial gate material portion 18P into the oxide liner 26. The oxide liner 26 that is formed thus has a sidewall surface that is vertically aligned to the sidewall surfaces of each hard mask portion 22P, each top spacer portion 20P, and each bottom spacer 16P.

Figure 3:
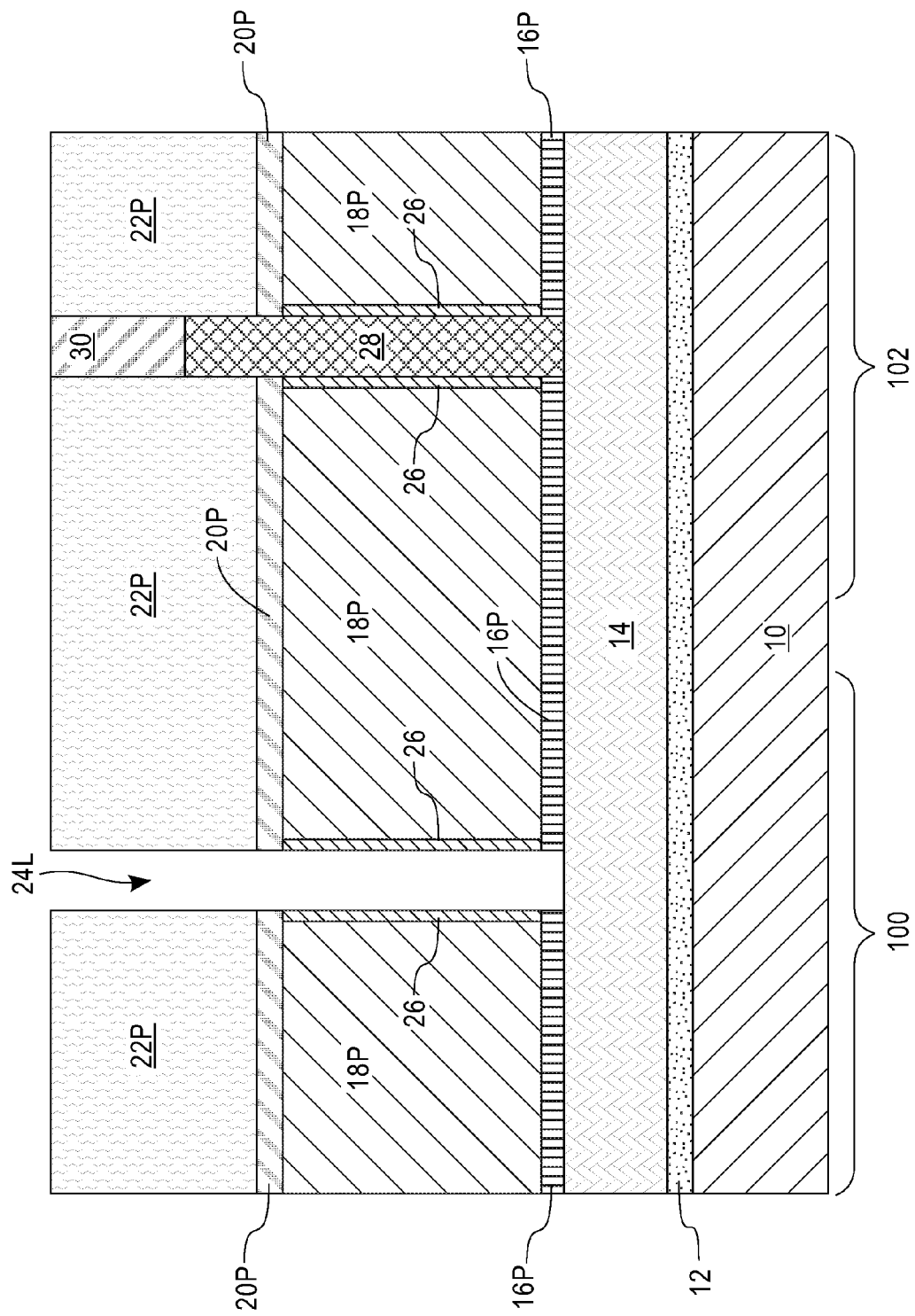
FIG. 3 is a cross sectional view of the exemplary semiconductor structure of FIG. 2 after forming a second epitaxial semiconductor channel material having a second dopant concentration in a portion of the second opening and forming a dielectric cap on the second epitaxial semiconductor channel material.

Referring now to FIG. 3, there is illustrated the exemplary semiconductor structure of FIG. 2 after forming a second epitaxial semiconductor channel material 28 having a second dopant concentration in a portion of the second opening 24R and forming a dielectric cap 30 on the second epitaxial semiconductor channel material 28. In such an embodiment, and during the formation of the second epitaxial semiconductor channel material 28 and the dielectric cap 30, a block mask (not shown) such as a photoresist may be formed over the first device region 100. The block mask can be removed after forming the second epitaxial semiconductor channel material 28 and the dielectric cap 30. In some embodiments, the first opening 24L may be processed prior to processing the second opening 24R.

The second epitaxial semiconductor channel material 28 may include one of the semiconductor materials mentioned above for the base semiconductor substrate 10. In some embodiments, the semiconductor material that provides the second epitaxial semiconductor channel material 28 may be composed of a same semiconductor material as the bottom source/drain semiconductor material layer 14. For example, the second epitaxial semiconductor channel material 28 and the bottom source/drain semiconductor material layer 14 may both be composed of silicon. In another embodiment, the second epitaxial semiconductor channel material 28 may be composed of a different semiconductor material than the bottom source/drain semiconductor material layer 14. For example, the second epitaxial semiconductor channel material 28 may be composed of a high mobility channel material such as, for example, germanium, a silicon germanium alloy or a III-V compound semiconductor, while the bottom source/drain semiconductor material layer 14 may be composed of silicon.

The second epitaxial semiconductor channel material 28 also contains a dopant which is present in the second dopant concentration. The dopant that is present in the second epitaxial semiconductor channel material 28 is of a same conductivity type (i.e., first conductivity type) as the semiconductor material layer 12. The second dopant concentration can be from $1 \times 10^{16}$ atoms/cm$^3$ to $1 \times 10^{18}$ atoms/cm$^3$. The second dopant concentration can be used to provide a transistor of a PROM cell having a second threshold voltage which is lower than a positive supply power, VDD. As such, the transistor of the PROM cell having the second threshold voltage is programmed to store a "1" state.

The second epitaxial semiconductor channel material 28 may be formed utilizing an epitaxial growth (or deposition) process as defined above, followed by a recess etch. The dopant is introduced during the epitaxial growth of the second epitaxial semiconductor channel material 28. An optional planarization process such as, for example, chemical mechanical polishing (CMP), may be employed between the epitaxial growth and recess etch step. The recess etch employed is selective in removing the semiconductor material that provides the second epitaxial semiconductor channel material 28. In one embodiment, recessing may be performed utilizing a timed reactive ion etch. The second epitaxial semiconductor channel material 28 that is formed has a topmost surface that is located between the topmost surface and the bottommost surface of each hard mask portion 22P.

Dielectric cap 30 is then formed on a topmost surface of the second epitaxial semiconductor channel material 28. The dielectric cap 30 has a different etch rate than the hard mask material that provides the hard mask layer 22. Hence, the dielectric cap 30 is composed of a different dielectric material than hard mask layer 22. In one example, the dielectric cap 30 may be composed of silicon nitride, while the hard mask layer 22 may be composed of silicon dioxide.

The dielectric cap 30 can be formed utilizing a deposition process such as, for example, chemical vapor deposition or plasma enhanced chemical vapor deposition. A planarization process such as, for example, chemical mechanical polishing (CMP), may follow the deposition of the dielectric material that provides the dielectric cap 30. As is shown, sidewall surfaces of the dielectric cap 30 are vertically aligned with the sidewall surfaces of the underlying second epitaxial semiconductor channel material 28.

Figure 4:
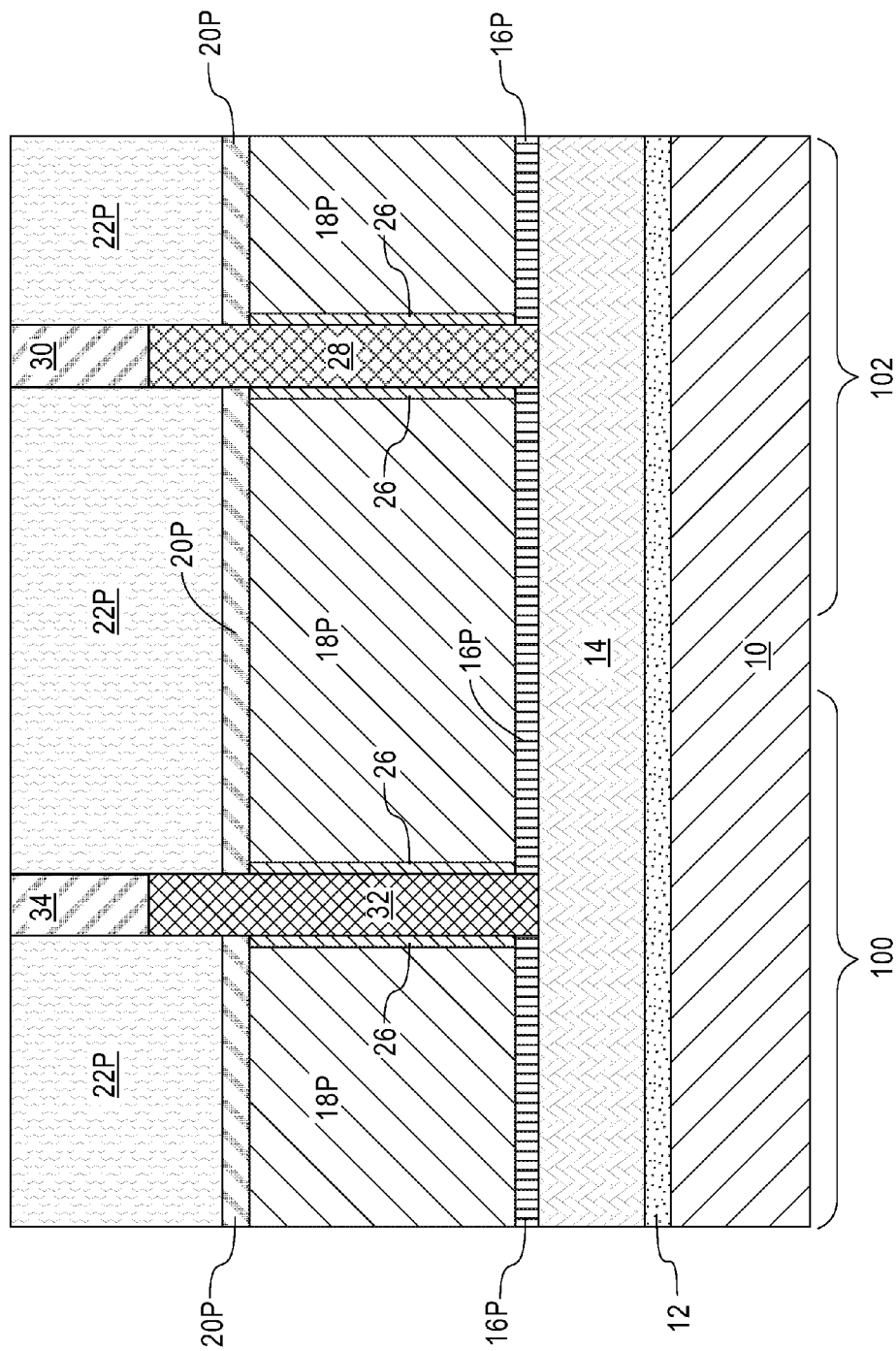
FIG. 4 is a cross sectional view of the exemplary semiconductor structure of FIG. 3 after forming a first epitaxial semiconductor channel material having a first dopant concentration that differs from the second dopant concentration in a portion of the first opening and forming another dielectric cap on the first epitaxial semiconductor channel material.

Referring now to FIG. 4, there is illustrated the exemplary semiconductor structure of FIG. 3 after forming a first epitaxial semiconductor channel material 32 having a first dopant concentration that differs from the second dopant concentration in a portion of the first opening 24L and forming another dielectric cap 34 on the first epitaxial semiconductor channel material 32. Dielectric cap 30 may be referred to as a second dielectric cap, while dielectric cap 34 may be referred to a first dielectric cap. In some embodiments, the first epitaxial semiconductor channel material 32 and the dielectric cap 34 may be formed prior to forming the second epitaxial semiconductor channel material 28 and the dielectric cap 30.

The first epitaxial semiconductor channel material 32 can include one of the semiconductor materials mentioned above for the second epitaxial semiconductor channel material 28. In some embodiments, the first epitaxial semiconductor channel material 32 may be composed of a same semiconductor material as the second epitaxial semiconductor channel material 28. In yet other embodiments, the first epitaxial semiconductor channel material 32 may be composed of a different semiconductor material than the second epitaxial semiconductor channel material 28. The first epitaxial semiconductor channel material 28 may be composed of a same, or different, semiconductor material than the bottom source/drain semiconductor material layer 14. The first epitaxial semiconductor channel material 32 may be formed utilizing the processing steps mentioned above for forming the second epitaxial semiconductor channel material 28.

The first epitaxial semiconductor channel material 32 contains a dopant which is present in the first dopant concentration. The dopant that is present in the first epitaxial semiconductor channel material 32 is of a same conductivity type (i.e., first conductivity type) as the semiconductor material layer 12. The first dopant concentration, which differs from the second dopant concentration, can be from $1 \times 10^{18}$ atoms/cm$^3$ to $5 \times 10^{18}$ atoms/cm$^3$. The first dopant concentration can be used to provide a transistor having a first threshold voltage, which differs from the second threshold voltage, and which is greater than the positive supply power, VDD. As such, the transistor having the first threshold voltage is programmed to store a "0" state. The dopant is introduced during the epitaxial growth of the first epitaxial semiconductor channel material 32.

Dielectric cap 34 may include one of the dielectric materials mentioned above for dielectric cap 30. Dielectric cap 34 may comprise a same dielectric material as, or a different dielectric material than, dielectric cap 30. Dielectric cap 34 can be formed utilizing the same technique mentioned above for forming dielectric cap 30.

Figure 5:
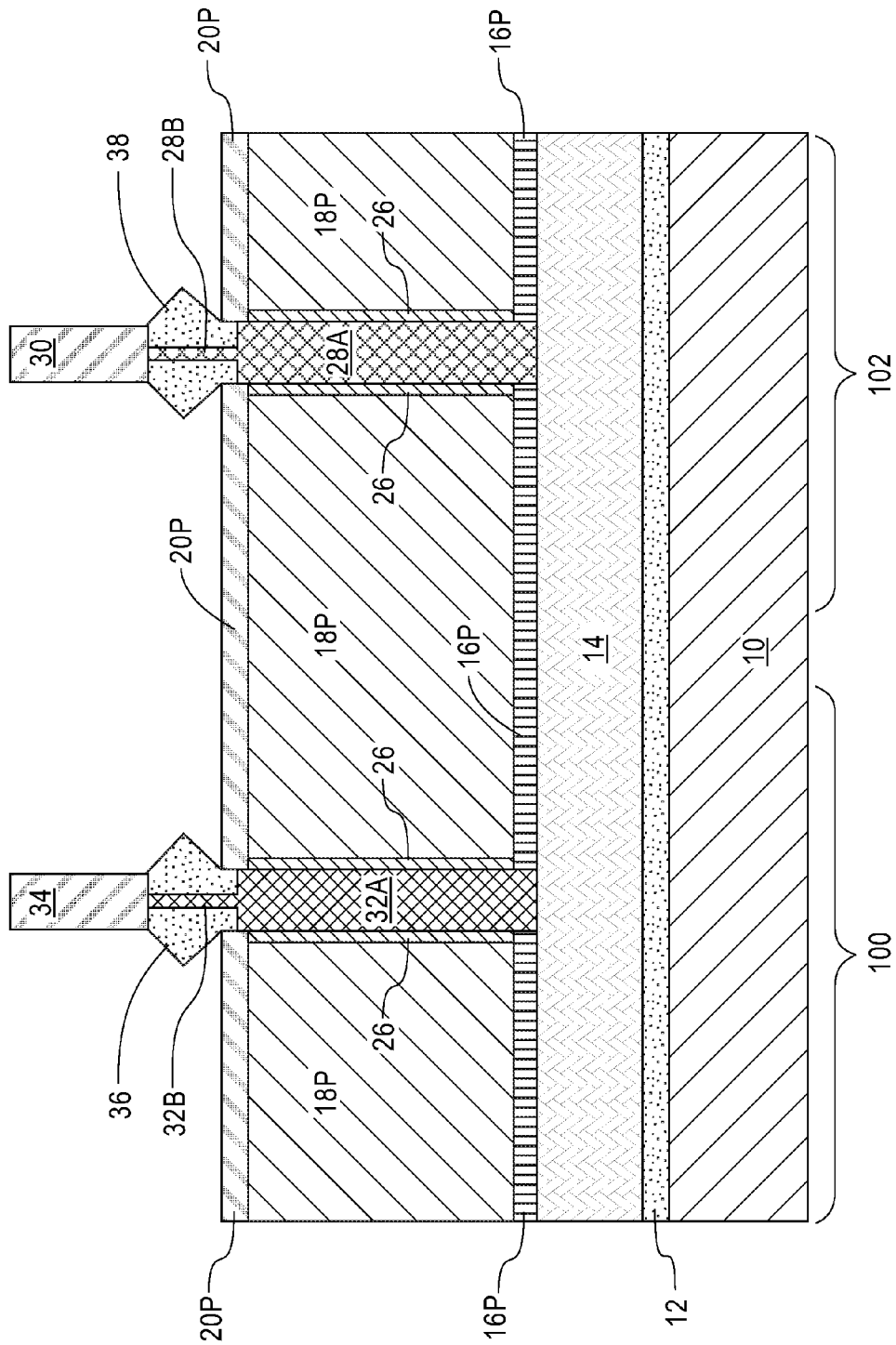
FIG. 5 is a cross sectional view of the exemplary semiconductor structure of FIG. 4 after removing remaining portions of the hard mask layer, laterally etching exposed portions of both the first and second epitaxial semiconductor channel materials, and epitaxially growing a first top source/drain structure from each recessed sidewall of an upper portion of the first epitaxial semiconductor channel material and a second top source/drain structure from each recessed sidewall of an upper portion of the second epitaxial semiconductor channel material.

Referring now to FIG. 5, there is illustrated the exemplary semiconductor structure of FIG. 4 after removing remaining portions of the hard mask layer (i.e., each hard mask portion 22P), laterally etching exposed portions of both the first and second epitaxial semiconductor channel materials (32, 28), and epitaxially growing a first top source/drain structure 36 from each recessed sidewall of an upper portion 32B of the first epitaxial semiconductor channel material 32 and a second top source/drain structure 38 from each recessed sidewall of an upper portion 28B of the second epitaxial semiconductor channel material 28. The first top source/drain structure 36 and the second top source/drain structure 38 may be formed simultaneously or in any order.

Each hard mask portion 22P may be removed utilizing an etching process that is selective in removing the hard mask material that provides the hard mask layer 22 stopping on each top spacer portion 20P. In one example, and when the hard mask portions 22P are composed of silicon dioxide, aqueous hydrofluoric acid may be employed as an etchant. The removal of each hard mask portion 22P exposes an upper portion of the first and second epitaxial semiconductor channel materials (32, 28). The exposed upper portion of each of the first and second epitaxial semiconductor channel materials (32, 28) is then subjected to a lateral etch (i.e., recessing) process to provide an upper portion (32B, 28B) of the first and second first epitaxial semiconductor channel materials (32, 28) whose width is less than the non-etched portion (i.e., lower portion (32A, 28A)) of the epitaxial semiconductor channel materials (32, 28).

Next, the first and second top source/drain structures (36, 38) are epitaxially grown from each exposed sidewall surface of the upper portion (32B, 28B) of the respective epitaxial semiconductor channel material (32, 28). The epitaxial growth (or deposition) used to provide the top source/drain structures (36, 38) is as defined above. Each top source/drain structure (36, 38) includes a semiconductor material and a dopant (n-type or p-type) as defined above. The dopant, which is of the same conductivity type as the bottom source/drain semiconductor material layer 14, can be added during the epitaxial growth of the semiconductor material that provides each top source/drain structure (36, 38) or after epitaxially depositing an intrinsic semiconductor material utilizing a gas phase doping process. The dopant can be present in the first and second top source/drain structures (36, 38) in a range as mentioned above for the bottom source/drain semiconductor material layer 14. The semiconductor material that provides the first top source/drain structure 36 may be the same as, or different from, the semiconductor material that provides the first epitaxial semiconductor channel material 32. Likewise, the semiconductor material that provides the second top source/drain structure 38 may be the same as, or different from, the semiconductor material that provides the second epitaxial semiconductor channel material 28. The first and second top source/drain structure (36, 38) may be composed of a same, or different semiconductor material.

In some embodiments, and as shown, each top source/drain structure (36, 38) may have faceted surfaces, i.e., non-planar surfaces. In some embodiments and as shown, each top source/drain structure (36, 38) is triangular in shape, wherein the base of the triangle directly contacts one of the sidewalls of the upper portion 32B or 28B of the respective epitaxial semiconductor channel material (32, 28) and the tip of the triangle extends outward from the one sidewall of the upper portion 32B or 28B of the respective epitaxial semiconductor channel material (32, 28). In some embodiments, and as shown, the tip of each triangle may extend beyond the sidewall surfaces of the respective epitaxial semiconductor channel material (32, 28).

During the epitaxial growth process and as shown, a portion of each top source/drain structure (36, 38) may contact an exposed topmost surface of the lower portion (32A, 28A) of the respective epitaxial semiconductor channel material (32, 28); epitaxial growth is prevented from the topmost surface of the upper portion 32B or 28B of the respective epitaxial semiconductor channel material (32, 28) due to the presence of the dielectric cap (34, 30).

Figure 6:
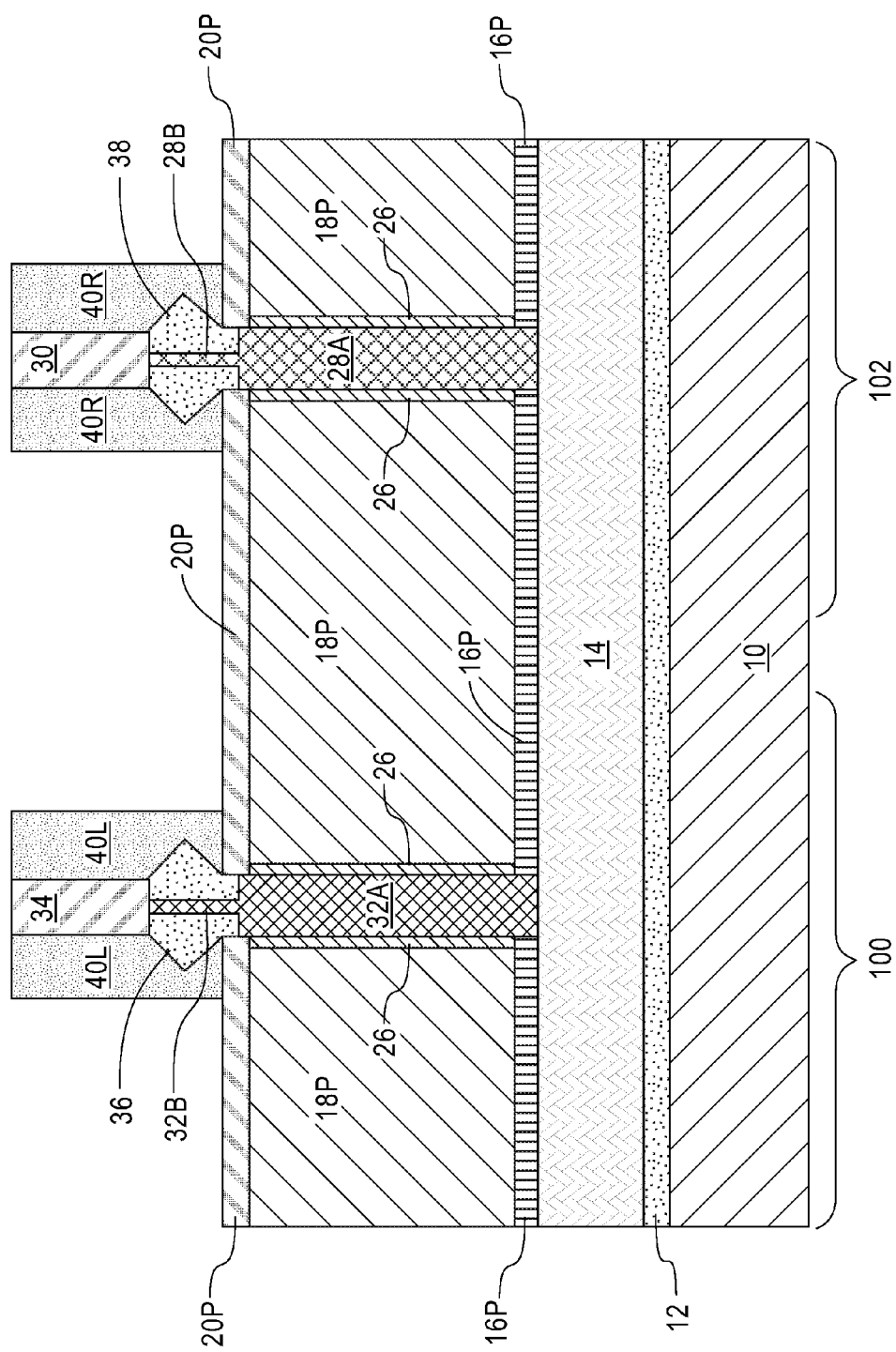
FIG. 6 is a cross sectional view of the exemplary semiconductor structure of FIG. 5 after forming a dielectric spacer protecting each of the first and second top source/drain structures.

Referring now to FIG. 6, there is illustrated the exemplary semiconductor structure of FIG. 5 after forming a dielectric spacer 40L, 40R protecting a respective first and second top source/drain structure (36, 38). Each dielectric spacer 40L, 40R may include any dielectric spacer material including, for example, silicon dioxide, silicon nitride and/or silicon oxynitride. The dielectric spacer material that provides the dielectric spacer 40L, 40R is composed of a different material than at least the top spacer layer 20. Each dielectric spacer 40L, 40R may be formed utilizing a deposition process, followed by a spacer etch. Dielectric spacer 40L may be composed of a same dielectric material as, or a different dielectric material than dielectric spacer 40R.

Figure 7:
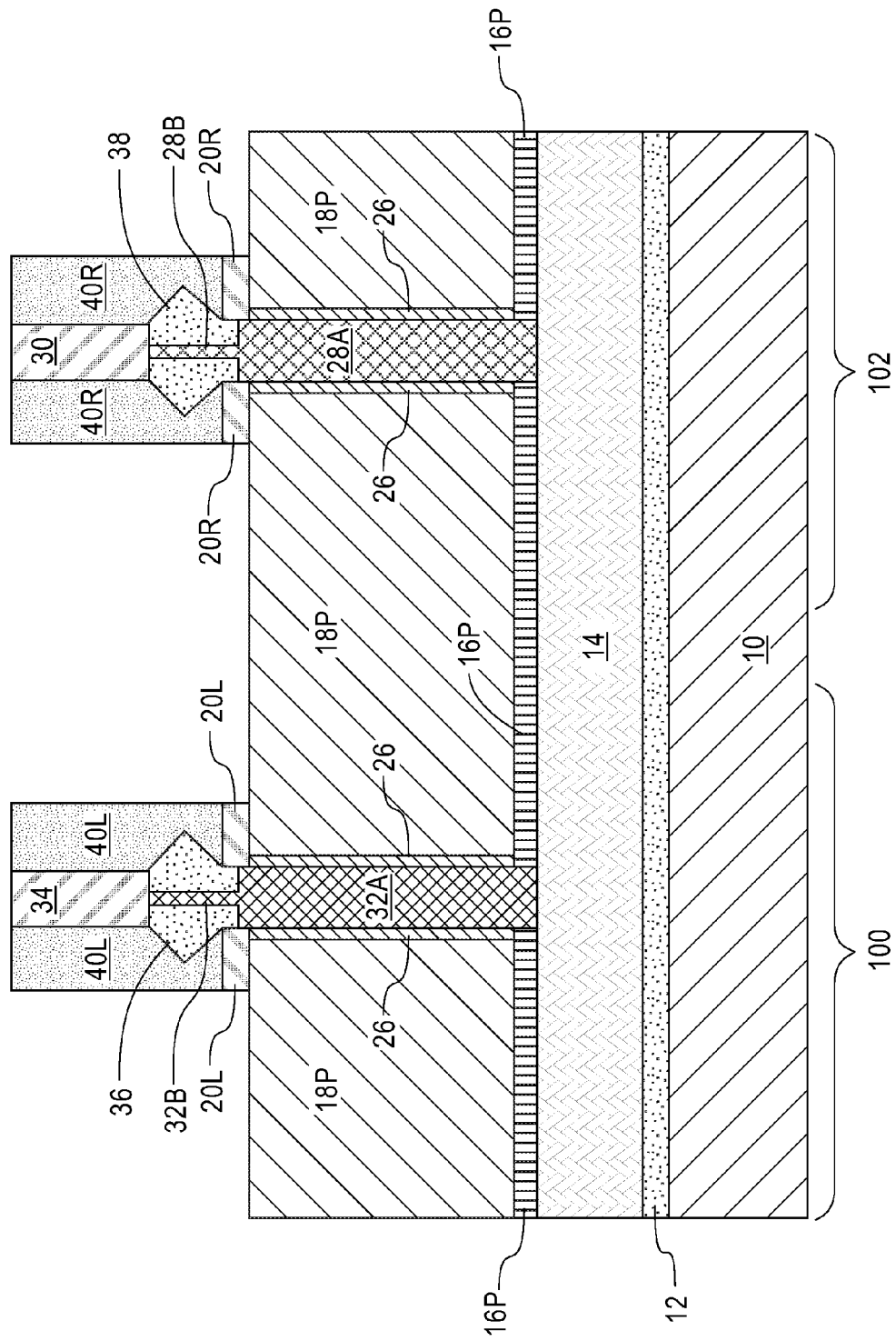
FIG. 7 is a cross sectional view of the exemplary semiconductor structure of FIG. 6 after removing each top spacer portion that is not protected by the dielectric spacer.

Referring now to FIG. 7, there is illustrated the exemplary semiconductor structure of FIG. 6 after removing each top spacer portion 20P that is not protected by the dielectric spacer 40L, 40R. The removal of the top spacer portion 20P that is not protected by the dielectric spacer 40L, 40R can be performed utilizing an anisotropic etch. As is shown, portions of each top spacer portion 20P remain beneath the dielectric spacers 40L, 40R. The remaining portions of the top spacer portions 20P may be referred to herein as top spacer structures 20L, 20R. As is shown, an outermost sidewall surface of each top spacer structure 20L, 20R is vertically aligned to the outermost sidewall surface of the overlying dielectric spacer 40L, 40R.

Figure 8:
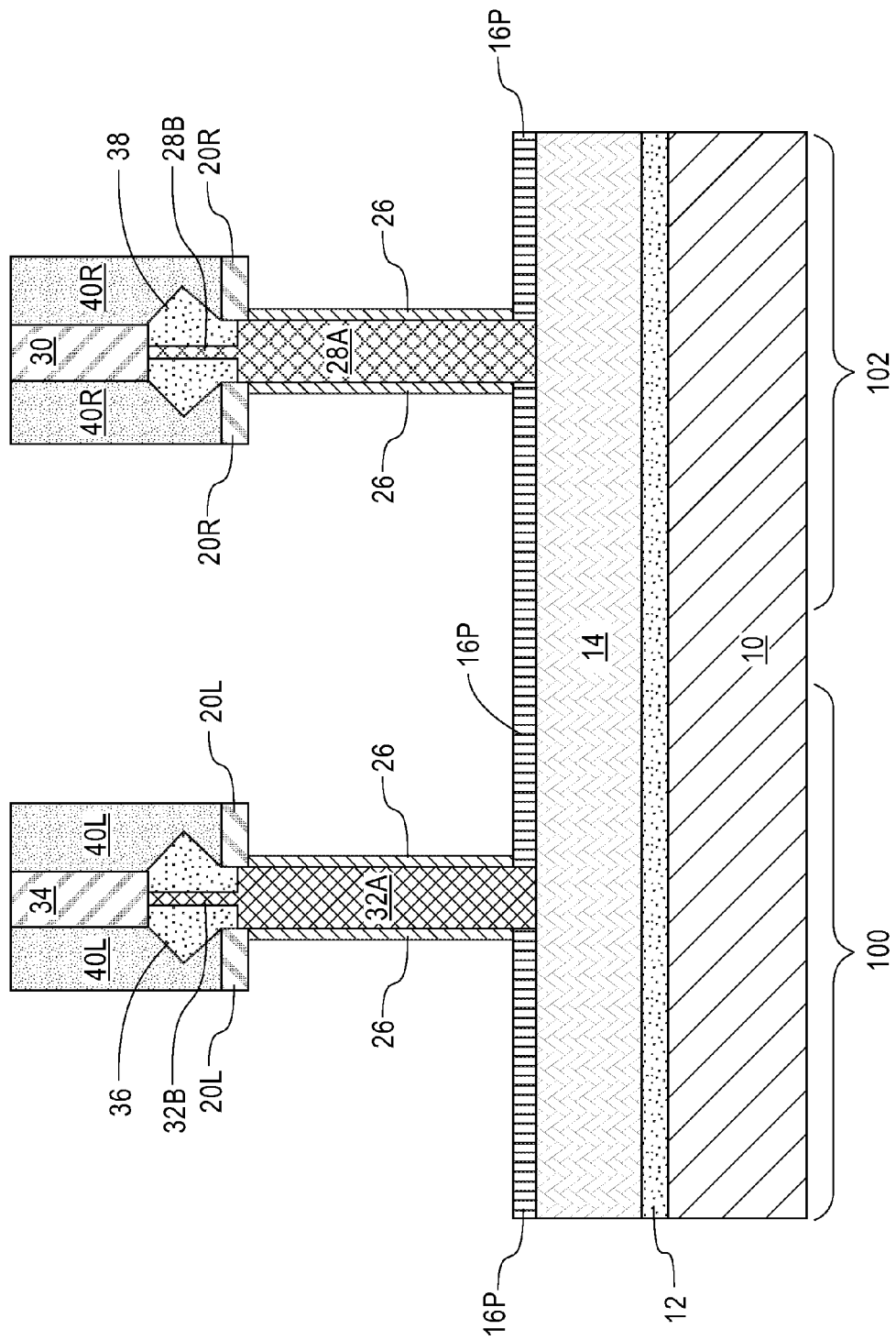
FIG. 8 is a cross sectional view of the exemplary semiconductor structure of FIG. 7 after removing remaining portions of the sacrificial gate material layer.

Referring now to FIG. 8, there is illustrated the exemplary semiconductor structure of FIG. 7 after removing remaining portions of the sacrificial gate material layer (i.e., each sacrificial gate material portion 18P). The sacrificial gate material portions 18P may be removed utilizing a single etching process or a combination of etching processes may be used. The removal of each sacrificial gate material portion 18P exposes a topmost surface of each bottom spacer portion 16P and an outer sidewall of the oxide liner 26.

Figure 9:
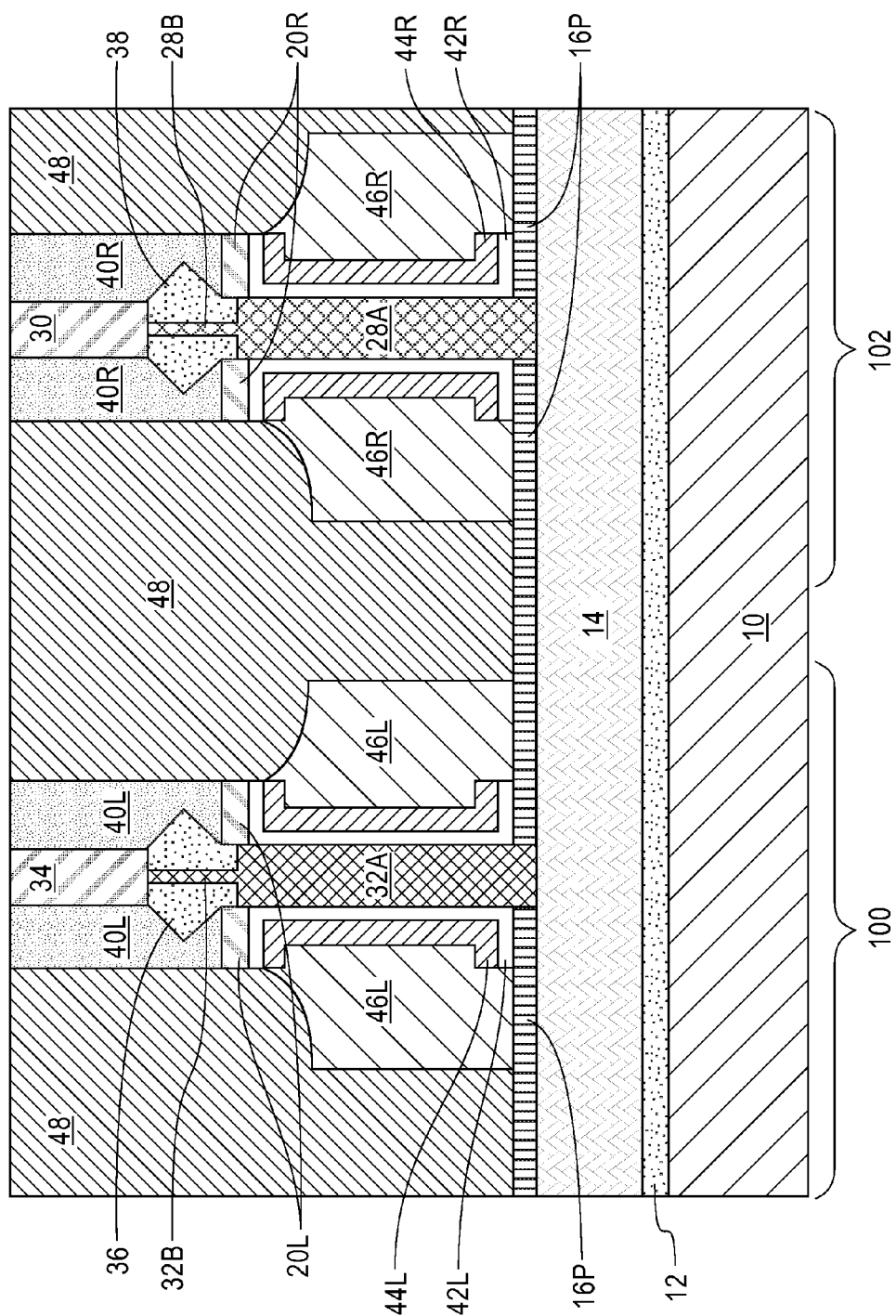
FIG. 9 is a cross sectional view of the exemplary semiconductor structure of FIG. 8 after removing the oxide liner, forming a first functional gate structure on each exposed sidewall of a lower portion of the first epitaxial semiconductor channel material, and a second functional gate structure on each exposed sidewall of a lower portion of the second epitaxial semiconductor channel material, and forming a middle-of-the-line (MOL) dielectric material laterally surrounding the first and second functional gate structures.

Referring now to FIG. 9, there is illustrated the exemplary semiconductor structure of FIG. 8 after removing the oxide liner 26, forming a first functional gate structure (42L, 44L, 46L) on each exposed sidewall of the lower portion 32A of the first epitaxial semiconductor channel material 32, and a second functional gate structure (42R, 44R, 46R) on each exposed sidewall of the lower portion 28A of the second epitaxial semiconductor channel material 28, and forming a middle-of-the-line (MOL) 48. The first and second functional gate structures may be formed simultaneously or in any order. By "functional gate structure" it is meant a permanent gate structure used to control output current (i.e., flow of carriers in the channel) of a semiconducting device through electrical or magnetic fields.

The removal of the oxide liner 26 may be performed utilizing an etching process that is selective in removing the oxide liner 26. In one embodiment of the present application, the oxide liner 26 may be removed utilizing aqueous hydrofluoric acid as an etchant. The removal of the oxide liner 26 exposes the sidewall surfaces of the lower portion (32A, 28A) of the respective epitaxial semiconductor channel material (32, 28).

Each functional gate structure includes a gate dielectric portion 42L, 42R, an inner gate conductor portion 44L, 44R, and an outer gate conductor portion 46L, 46R. In some embodiments, the inner gate conductor portion 44L, 44R can be omitted.

Each gate dielectric portion 42L, 42R is composed of a gate dielectric material such as, for example, a dielectric oxide, nitride, and/or oxynitride. In one example, the gate dielectric material that provides each gate dielectric portion 42L, 42R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material of each gate dielectric portion 42L, 42R. Gate dielectric portion 42L may comprise a same, or different gate dielectric material, as gate dielectric portion 42R. The gate dielectric material that provides each gate dielectric portion 42L, 42R can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material that can provide each gate dielectric portion 42L, 42R can have a thickness in a range from 1 nm to 10 nm. Other thicknesses that are lesser than, or greater than, the aforementioned thickness range can also be employed for the gate dielectric material of each gate dielectric portion 42L, 42R.

Each inner gate conductor portion 44L, 44R, which is contact with a sidewall of a respective gate dielectric portion 42L, 42R, can include a gate conductor material. The gate conductor material used in providing each inner gate conductor portion 44L, 44R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Each inner gate conductor portion 44L, 44R may be composed of nFET gate metal or a pFET gate metal. The inner gate conductor portion 44L may comprise a same or different gate conductor material than the inner gate conductor portion 44R. The gate conductor material used in providing each inner gate conductor portion 44L, 44R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, inner gate conductor portion 44L, 44R can have a thickness from 50 nm to 200 nm. Other thicknesses that are lesser than, or greater than, the aforementioned thickness range can also be employed for the inner gate conductor portion 44L, 44R.

In the present application, a blanket layer of a gate dielectric material and a blanket layer of an inner gate conductor material are first formed and then patterned into gate dielectric portions 42L, 42R and inner gate conductor portions 44L, 44R.

Next, each outer gate conductor portion 46L, 46R is formed. Each outer gate conductor portion 46L, 46R comprises one of the conductor materials mentioned above for the inner gate conductor portions 44L, 44R. Typically, but not necessarily always, the outer gate conductor portion 46L, 46R comprises a different gate conductor material than the inner gate portion 44L, 44R. For example, each inner gate conductor portion 44L, 44R may include an nFET gate metal or a pFET gate metal and the outer gate conductor portion 46L, 46R may comprise polysilicon or an elemental metal such as tungsten. Each outer gate conductor portion 46L, 46R can be formed by first depositing an outer gate conductor material utilizing one of the deposition processes mentioned above in forming the inner gate conductor portion 44L, 44R. A planarization process such as, for example, CMP, may be employed after depositing the outer gate conductor material. The outer gate conductor material is then recessed. The recessing of the outer gate conductor material may be performed utilizing an etch back process that is selective in removing the outer gate conductor material. The recessed portion of the outer gate conductor material can then be patterned to provide the outer gate conductor portions 46L, 46R shown in FIG. 9. The patterning of each recessed second conductor material may be performed by lithography and etching as defined above.

After forming the first and second functional gate structures, MOL dielectric material 48 is formed. The MOL dielectric material 48 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material 48. The use of a self-planarizing dielectric material as the MOL dielectric material 48 may avoid the need to perform a subsequent planarizing step.

In one embodiment, the MOL dielectric material 48 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 48, a planarization process or an etch back process follows the deposition of the dielectric material that provides the MOL dielectric material 48.

Figure 10:
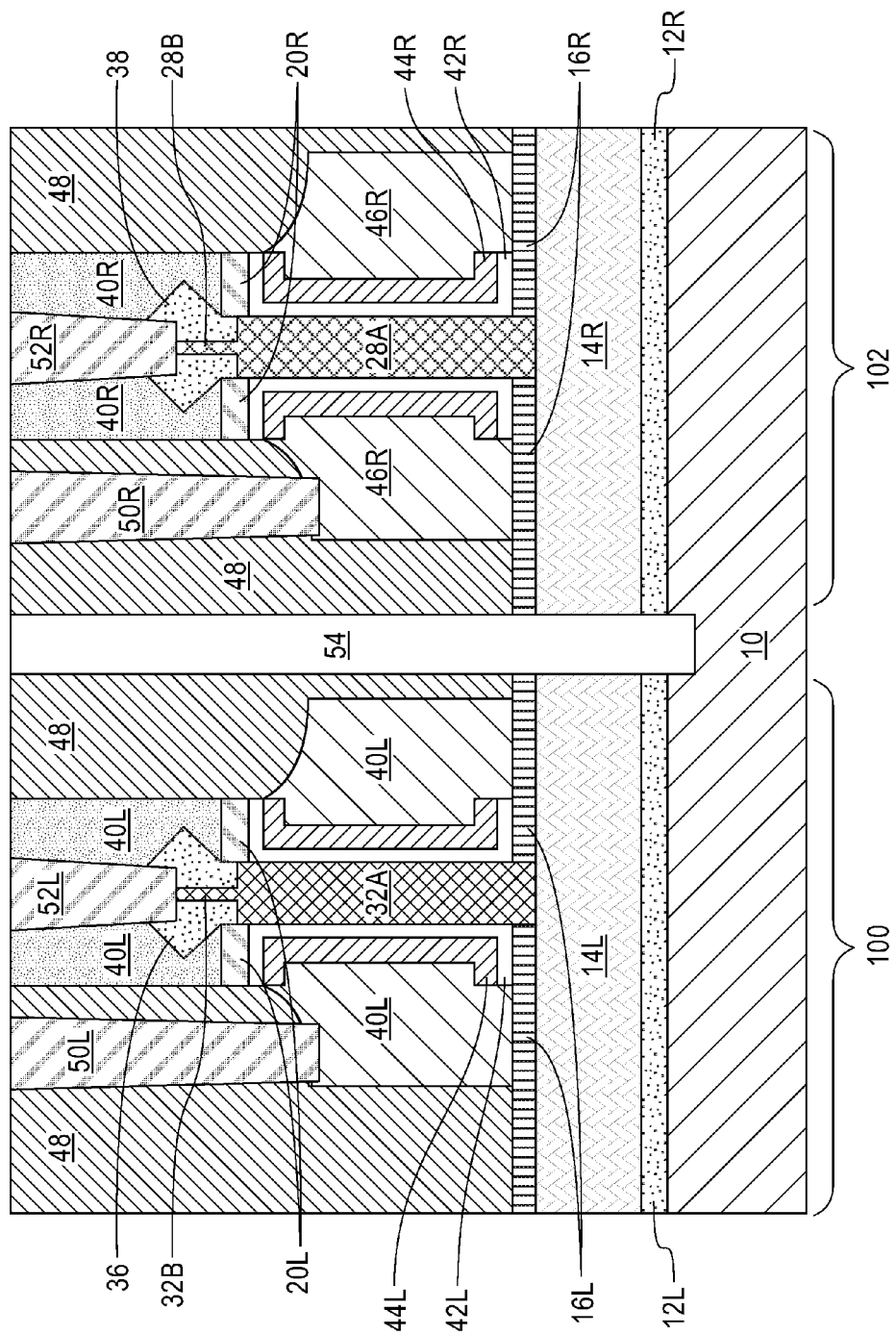
FIG. 10 is a cross sectional view of the exemplary semiconductor structure of FIG. 9 after forming contact structures and an isolation structure.

Referring now to FIG. 10, there is illustrated the exemplary semiconductor structure of FIG. 9 after forming contact structures 50L, 50R, 52L, 52R and an isolation structure 54. Notably, there is shown the structure after forming, in any order, a gate contact structure (or word line) 50L, 50R extending through the MOL dielectric material 48 and contacting the outer gate conductor portion 46L, 46R and a source/drain contact structure (bit line) 52L, 52R contacting the top source/drain structure 36, 38.

The various contact structures can be formed by first providing a contact opening within the MOL dielectric material 48. Lithography and etching, as defined above, can be used to provide each contact opening. Each contact opening is then filled with at least a contact metal such as, for example, copper, tungsten or a copper-tungsten alloy. In some embodiments, a metal semiconductor alloy, i.e., a silicide, may be formed prior to filling each contact opening with a contact metal.

Isolation structure 54 can be formed by forming a trench by lithography and etching that extends from the topmost surface of the MOL dielectric material 48 into a portion of the base semiconductor substrate 10 and then filling the trench with a trench dielectric material. The isolation structure 54 can separate two device regions, e.g., device region 100 and 102, from each other. After defining the trench, portions of the bottom spacer portion 16P, portions of the bottom source/drain semiconductor material layer 14 and portions of the semiconductor material layer 12 remain. Each remaining portions of the bottom spacer portion 16P may be referred to as a bottom spacer 16L, each remaining portion of the bottom source/drain semiconductor material layer 14 may be referred to herein as a bottom source/drain structure 14L, 14R, while each remaining portion of semiconductor material layer 12 may be referred to as a semiconductor material layer portion 12L, 12R.

In some embodiments (not shown), a conventional vertical transistor is formed adjacent to at least one of the first device region 100 or the second device region 102. The conventional vertical transistor would look similar to the vertical transistors depicting in FIG. 10 except that the epitaxial semiconductor channel material is not tuned to provide a specific threshold voltage.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A programmable read-only memory (PROM) cell comprising:
   a first vertical transistor programmed to store a "0" state and located in a first device region of a base semiconductor structure, the first vertical transistor comprising:
      a first bottom source/drain structure,
      a first epitaxial semiconductor channel material of a first dopant concentration extending upward from a topmost surface of the first bottom source/drain structure, the first epitaxial semiconductor channel material having a lower portion of a first width and an upper portion of a second width that is less than the first width,
      a first functional gate structure located on each side of the lower portion of the first epitaxial semiconductor channel material, and
      a first top source/drain structure extending outward from a sidewall of the upper portion of the first epitaxial semiconductor channel material; and
   a second vertical transistor programmed to store a "1" state and located in a second device region of the base semiconductor substrate, the second vertical transistor comprising:
      a second bottom source/drain structure,
      a second epitaxial semiconductor channel material of a second dopant concentration, different from the first dopant concentration, extending upward from a topmost surface of the second bottom source/drain structure, the second epitaxial semiconductor channel material having a lower portion of a first width and an upper portion of a second width that is less than the first width,
      a second functional gate structure located on each side of the lower portion of the second epitaxial semiconductor channel material, and
      a second top source/drain structure extending outward from a sidewall of the upper portion of the second epitaxial semiconductor channel material.

2. The PROM cell of claim 1, wherein the first dopant concentration is from $1\times10^{16}$ atoms/cm$^3$ to $1\times10^{18}$ atoms/cm$^3$ and the second dopant concentration is from $1\times10^{18}$ atoms/cm$^3$ to $5\times10^{18}$ atoms/cm$^3$.

3. The PROM cell of claim 1, wherein the first bottom source/drain structure is located on a topmost surface of a semiconductor material layer portion and the second bottom source/drain structure is located on a topmost surface of another semiconductor material layer portion, the semiconductor material layer portions are located on different portions of the topmost surface of the base semiconductor substrate.

4. The PROM cell of claim 1, wherein the first epitaxial semiconductor channel material has a different conductivity than both the first bottom source/drain structure and the first top source/drain structure, and the second epitaxial semiconductor channel material has a different conductivity than both the second bottom source/drain structure and the second top source/drain structure.

5. The PROM cell of claim 1, further comprising a bottom spacer structure located below each first functional gate structure and each second functional gate structure, and a top spacer structure located above each first functional gate structure and each second functional gate structure.

6. The PROM cell of claim 5, further comprising a dielectric spacer located on a topmost surface of each top spacer structure and laterally surrounding the first top source/drain structure and the second top source/drain structure.

7. The PROM cell of claim 1, wherein each of the first and second functional gate structures comprises a gate dielectric portion, an inner gate conductor portion and an outer gate electrode portion.

8. The PROM cell of claim 1, further comprising a middle-of-the-line (MOL) dielectric material laterally surrounding the first and second vertical transistors.

9. The PROM cell of claim 8, further comprising a first word line located in the MOL dielectric material and contacting an outer gate conductor portion of one of the first functional gate structures, a first bit line located in the MOL dielectric material and contacting a topmost surface of the upper portion of the first epitaxial semiconductor channel material, a second word line located in the MOL dielectric material and contacting an outer gate conductor portion of one of the second functional gate structures, and a second bit line located in the MOL dielectric material and contacting a topmost surface of the upper portion of the second epitaxial semiconductor channel material.

10. The PROM cell of claim 9, further comprising an isolation structure located in the MOL dielectric material and extending into a surface of the base semiconductor substrate, the isolation structure separates the first device region from the second device region.

11. A method of forming a programmable read-only memory (PROM) cell, the method comprising:
forming, in any order, a first epitaxial semiconductor channel material having a first dopant concentration extending upward from a first portion of a topmost surface of a bottom source/drain semiconductor material layer that is located above a base semiconductor substrate, and a second epitaxial semiconductor channel material having a second dopant concentration different from the first dopant concentration extending upward from a second portion of the topmost surface of the bottom source/drain semiconductor material layer, wherein the first and second epitaxial semiconductor channel materials each have a lower portion of a first width and an upper portion of a second width that is less than the first width;
forming a first top source/drain structure extending outward from each sidewall of the upper portion of the first epitaxial semiconductor channel material and contacting exposed portions of a topmost surface of the lower portion of the first epitaxial semiconductor channel material, and a second top source/drain structure extending outward from each sidewall of the upper portion of the second epitaxial semiconductor channel material and contacting exposed portions of a topmost surface of the lower portion of the second epitaxial semiconductor channel material; and
forming a first functional gate structure on each side of the first epitaxial semiconductor channel material, and a second functional gate structure each side of the second epitaxial semiconductor channel material, wherein the first dopant concentration programs each first functional gate structure to store a "0" state, and the second dopant concentration programs each second functional gate structure to store a "1" state.

12. The method of claim 11, further comprising forming a middle-of-the-line (MOL) dielectric material laterally surrounding the first and second functional gate structures.

13. The method of claim 12, further comprising forming a first word line in the MOL dielectric material and contacting an outer gate conductor portion of one of the first functional gate structures, a first bit line in the MOL dielectric material and contacting a topmost surface of the upper portion of the first epitaxial semiconductor channel material, a second word line in the MOL dielectric material and contacting an outer gate conductor portion of one of the second functional gate structures, and a second bit line in the MOL dielectric material and contacting a topmost surface of the upper portion of the second epitaxial semiconductor channel material.

14. The method of claim 12 further comprising forming an isolation structure in the MOL dielectric material and extending into a surface of the base semiconductor substrate.

15. The method of claim 11, wherein the forming the first and second epitaxial semiconductor channel materials comprises:
forming a material stack including at least the bottom source/drain semiconductor material layer, a bottom spacer layer, a sacrificial gate material layer, a top spacer layer, and a hard mask layer on said base semiconductor substrate;
forming a first opening and a second opening in the material stack, wherein the first opening exposes the first portion of the topmost surface of the bottom source/drain semiconductor material layer and the second opening exposes the second portion of the topmost surface of the bottom source/drain semiconductor material layer;
forming an oxide liner into exposed sidewalls of each remaining portion of the sacrificial gate material layer in the first and second openings;
epitaxially growing the first epitaxial semiconductor channel material in the first opening, and the second epitaxial semiconductor material in the second opening;
recessing the first and second epitaxial semiconductor channel materials;
forming a dielectric cap on a remaining portion of each of the first and second epitaxial semiconductor channel materials;

removing remaining portions of the hard mask layer; and
laterally recessing exposed upper portions of the remaining portion of each of the first and second epitaxial semiconductor channel materials.

16. The method of claim 15, wherein the forming the material stack comprises forming a semiconductor material layer directly beneath the bottom source/drain semiconductor material layer, wherein the semiconductor material layer is of a different conductivity type than the bottom source/drain semiconductor material layer.

17. The method of claim 11, wherein the forming the first and second top source/drain structures comprises an epitaxial growth process.

18. The method of claim 11, further comprising forming a dielectric spacer protecting a topmost surface of the upper portion of the first and second epitaxial semiconductor channel materials prior to forming the first and second top source/drain structures.

19. The method of claim 11 wherein the first dopant concentration is from $1\times10^{16}$ atoms/cm$^3$ to $1\times10^{18}$ atoms/cm$^3$ and the second dopant concentration is from $1\times10^{18}$ atoms/cm$^3$ to $5\times10^{18}$ atoms/cm$^3$.

20. The method of claim 11, wherein each of the first and second functional gate structures comprises a gate dielectric portion, an inner gate conductor portion and an outer gate electrode portion.

* * * * *